(12) United States Patent
Alapati et al.

(10) Patent No.: US 7,799,694 B2
(45) Date of Patent: Sep. 21, 2010

(54) METHODS OF FORMING SEMICONDUCTOR CONSTRUCTIONS

(75) Inventors: Ramakanth Alapati, Boise, ID (US);
Ardavan Niroomand, Boise, ID (US);
Gurtej S. Sandhu, Boise, ID (US);
Luan C. Tran, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 1078 days.

(21) Appl. No.: 11/402,659

(22) Filed: Apr. 11, 2006

(65) Prior Publication Data

US 2007/0238295 A1    Oct. 11, 2007

(51) Int. Cl.
    *H01L 21/302*    (2006.01)
(52) U.S. Cl. .................. 438/714; 438/639; 438/706
(58) Field of Classification Search .......... 438/706, 438/710, 712, 714, 720, 723, 424, 435, 637, 438/641, 648
    See application file for complete search history.

(56) References Cited

U.S. PATENT DOCUMENTS

| | | | |
|---|---|---|---|
| 4,356,211 A | 10/1982 | Riseman | |
| 4,472,240 A | 9/1984 | Kameyama | |
| 4,533,430 A | 8/1985 | Bower | |
| 4,639,288 A | 1/1987 | Price et al. | |
| 4,825,277 A | 4/1989 | Mattox et al. | |
| 5,021,846 A | 6/1991 | Ueno | |
| 5,801,083 A * | 9/1998 | Yu et al. | 438/424 |
| 5,872,045 A | 2/1999 | Lou et al. | |
| 5,928,428 A | 7/1999 | Horie | |
| 5,930,595 A | 7/1999 | Sridhar et al. | |
| 5,945,707 A | 8/1999 | Bronner et al. | |
| 6,121,082 A | 9/2000 | Linliu et al. | |

(Continued)

FOREIGN PATENT DOCUMENTS

FR    2 826 179    12/2002

(Continued)

OTHER PUBLICATIONS

Shin, S.H., et al. "Data Retention Time and Electrical Characteristics of Cell Transistor According to STI Materials in 90 nm DRAM" Journal of he Korean Physical Society, vol. 43, No. 5, pp. 887-891 Nov. 2003.

(Continued)

*Primary Examiner*—Lan Vinh
(74) *Attorney, Agent, or Firm*—Wells St. John PS (57) ABSTRACT

The invention includes methods of forming isolation regions for semiconductor constructions. A hard mask can be formed and patterned over a semiconductor substrate, with the patterned hard mask exposing a region of the substrate. Such exposed region can be etched to form a first opening having a first width. The first opening is narrowed with a conformal layer of carbon-containing material. The conformal layer is punched through to expose substrate along a bottom of the narrowed opening. The exposed substrate is removed to form a second opening which joins to the first opening, and which has a second width less than the first width. The carbon-containing material is then removed from within the first opening, and electrically insulative material is formed within the first and second openings. The electrically insulative material can substantially fill the first opening, and leave a void within the second opening.

35 Claims, 10 Drawing Sheets

U.S. PATENT DOCUMENTS

| | | | |
|---|---|---|---|
| 6,150,212 | A | 11/2000 | Divakaruni et al. |
| 6,265,281 | B1 | 7/2001 | Reinberg |
| 6,277,709 | B1 | 8/2001 | Wang et al. |
| 6,322,634 | B1 | 11/2001 | Pan |
| 6,376,893 | B1 | 4/2002 | Rha |
| 6,383,877 | B1 | 5/2002 | Ahn et al. |
| 6,432,843 | B1 | 8/2002 | Kim et al. |
| 6,437,417 | B1 | 8/2002 | Gilton |
| 6,445,072 | B1 | 9/2002 | Subramanian et al. |
| 6,518,641 | B2 | 2/2003 | Mandelman et al. |
| 6,541,825 | B2 | 4/2003 | Kuroi et al. |
| 6,562,696 | B1 * | 5/2003 | Hsu et al. ............... 438/424 |
| 6,566,229 | B2 | 5/2003 | Hong et al. |
| 6,596,607 | B2 | 7/2003 | Ahn |
| 6,617,662 | B2 | 9/2003 | Park |
| 6,620,681 | B1 | 9/2003 | Kim et al. |
| 6,624,496 | B2 | 9/2003 | Ku et al. |
| 6,627,529 | B2 | 9/2003 | Ireland |
| 6,683,354 | B2 | 1/2004 | Heo et al. |
| 6,693,050 | B1 | 2/2004 | Cui et al. |
| 6,727,150 | B2 | 4/2004 | Tang |
| 6,780,721 | B2 | 8/2004 | Farrar |
| 6,791,155 | B1 | 9/2004 | Lo et al. |
| 6,841,440 | B2 | 1/2005 | Kuroi et al. |
| 6,867,098 | B2 | 3/2005 | Park et al. |
| 6,897,120 | B2 | 5/2005 | Trapp |
| 7,038,289 | B2 | 5/2006 | Marty et al. |
| 7,105,397 | B2 | 9/2006 | Hieda et al. |
| 7,196,396 | B2 * | 3/2007 | Ohta ..................... 257/510 |
| 7,208,812 | B2 | 4/2007 | Ohta |
| 7,279,377 | B2 | 10/2007 | Reuger et al. |
| 7,332,408 | B2 | 2/2008 | Violette |
| 7,332,789 | B2 | 2/2008 | Violette |
| 7,439,157 | B2 | 10/2008 | Bian et al. |
| 2002/0038901 | A1 | 4/2002 | Kuroi et al. |
| 2002/0055205 | A1 | 5/2002 | Lin et al. |
| 2002/0090795 | A1 | 7/2002 | Anh et al. |
| 2002/0146914 | A1 | 10/2002 | Huang et al. |
| 2003/0143810 | A1 | 7/2003 | Kuroi et al. |
| 2003/0207579 | A1 * | 11/2003 | Rattner et al. ............... 438/700 |
| 2004/0029389 | A1 * | 2/2004 | Lo .............. 438/694 |
| 2004/0097077 | A1 * | 5/2004 | Nallan et al. ............... 438/689 |
| 2004/0102031 | A1 | 5/2004 | Kloster et al. |
| 2004/0147093 | A1 | 7/2004 | Marty et al. |
| 2004/0224510 | A1 | 11/2004 | Sandhu et al. |
| 2004/0232496 | A1 | 11/2004 | Chen et al. |
| 2004/0235240 | A1 | 11/2004 | Hsu et al. |
| 2005/0112843 | A1 * | 5/2005 | Fischer et al. ............... 438/455 |
| 2005/0161729 | A1 | 7/2005 | Dong et al. |
| 2005/0287731 | A1 | 12/2005 | Bian et al. |
| 2006/0043455 | A1 | 3/2006 | Batra et al. |
| 2006/0255426 | A1 | 11/2006 | Inoue et al. |
| 2007/0170528 | A1 | 7/2007 | Partridge et al. |
| 2008/0128781 | A1 | 6/2008 | Violette |

FOREIGN PATENT DOCUMENTS

| | | |
|---|---|---|
| JP | 2206175 | 8/1990 |
| KR | 2000-0075409 | 12/2000 |
| KR | 2002-0027161 | 4/2002 |
| WO | WO85/03041 | 7/1985 |

OTHER PUBLICATIONS

Hong, S.H., et al. "A Novel T-Shaped Shallow Trench Isolation Technology" Apr. 2001 The Japan Society of Applied Physics.

US2006/026692, Oct. 7, 2006, PCT Search Report.

PCT/US2006/026692, Written Opinion of the Int'l Searching Authority, dated Aug. 12, 2005.

PCT/20061026692, Int'l Preliminary Report on Patentability dated May 29, 2008.

* cited by examiner

_Fig 3_

_Fig 4_

METHODS OF FORMING SEMICONDUCTOR CONSTRUCTIONS

TECHNICAL FIELD

The invention pertains to methods of forming semiconductor constructions.

BACKGROUND OF THE INVENTION

Trenched isolation regions (such as, for example, shallow trench isolation regions) are commonly utilized in integrated circuitry for electrically isolating electrical components from one another. The isolation regions extend into a semiconductor substrate, and comprise insulative material formed within trenches that have been etched into the substrate.

A problem that can occur during formation of trenched isolation regions is that voids can become trapped in the trenches during deposition of the insulative material within the trenches. The voids will have dielectric properties different than that of the insulative material, and accordingly will alter the insulative properties of the isolation regions. In response to this problem, numerous technologies have been developed for eliminating void formation within trenched isolation regions.

It is becoming increasingly difficult to eliminate void formation with increasing levels of integration. Specifically, trenched isolation regions are becoming narrower and deeper with increasing levels of integration, which renders it more difficult to uniformly fill the trenched isolation regions with insulative material.

In light of the above-discussed difficulties, it would be desirable to develop new methods for fabrication of trenched isolation regions which alleviate problems associated with voids. Although the invention described herein was motivated, at least in part, by the desire to alleviate problems associated with void formation in trenched isolation regions, persons of ordinary skill in the art will understand upon reading this disclosure and the claims that follow that aspects of the invention can have applications beyond trenched isolation regions.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention includes trenched structures configured to trap voids in particular regions of the trenches. The voids can thus be uniformly and controllably incorporated into a plurality of trenched structures across a substrate. Accordingly, the invention includes aspects in which prior art problems associated with the voids are alleviated, not by eliminating the voids, but rather by developing structures which can control the locations of the voids.

Exemplary aspects of the invention are described with reference to FIGS. 1-19.

Figure 1:
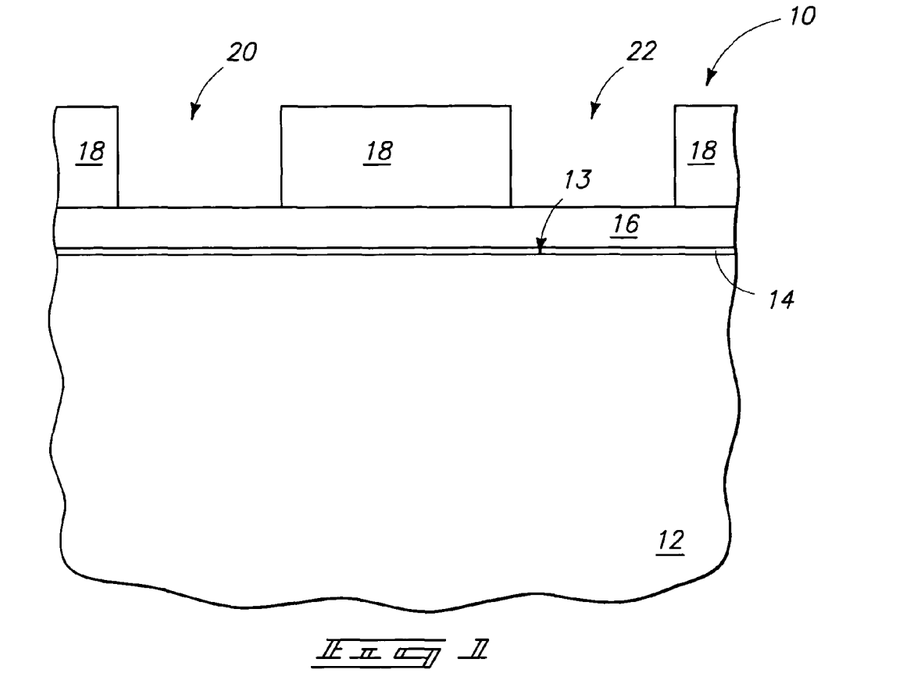
FIG. 1 is a diagrammatic, cross-sectional view of a fragment of a semiconductor construction at a preliminary processing stage in accordance with an exemplary aspect of the present invention.

Referring to FIG. 1, a semiconductor fragment 10 is illustrated at a preliminary processing stage in accordance with an exemplary aspect of the present invention. The fragment 10 comprises a semiconductor substrate 12. Substrate 12 can comprise, consist essentially of, or consist of, for example, monocrystalline silicon lightly-doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 12 is shown to comprise a planar, or at least substantially planar, top surface 13.

Hard mask layers (which can alternatively be referred to as hard masking layers) 14 and 16 are formed over the top surface of substrate 12; with the layer 14 shown to be directly against the top surface 13 of substrate 12, and the layer 16 shown to be directly against the layer 14.

The layer 14 can, for example, comprise, consist essentially of, or consist of silicon oxide; and the layer 16 can, for example, comprise, consist essentially of, or consist of silicon nitride. Accordingly, the layers 14 and 16 can be referred to as a silicon oxide-containing layer and a silicon nitride-containing layer, respectively.

Although two hard mask layers are shown, it is to be understood that the invention also includes aspects in which only a single hard mask layer is utilized, in which no hard mask layers are utilized, or in which more than two hard mask layers are utilized.

Patterned photoresist 18 is formed over layer 16. The photoresist can be patterned by photolithographic processing. The patterned photoresist has openings 20 and 22 extending therethrough to expose regions of hard mask layer 16. The openings 20 and 22 can correspond to trenches extending longitudinally in a direction into and out of the page relative to the cross-sectional view of FIG. 1.

Figure 2:
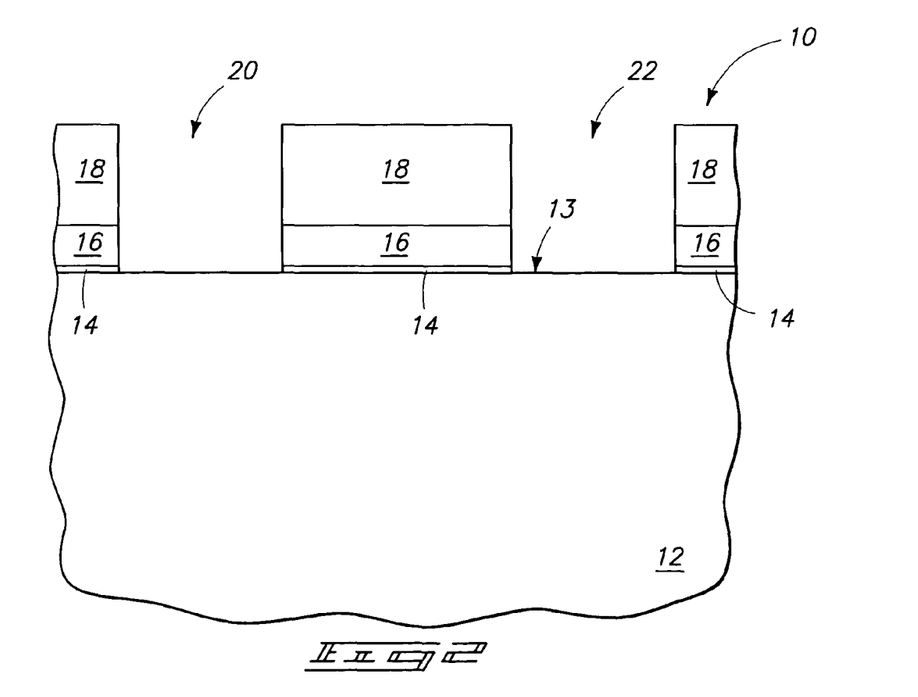
FIG. 2 is a view of the FIG. 1 wafer fragment shown at a processing stage subsequent to that of FIG. 1.

Referring to FIG. 2, openings 20 and 22 are transferred through mask layers 14 and 16 with one or more appropriate etches. The openings are shown to penetrate to, but not through, planarized upper surface 13 of substrate 12. It is to be understood, however, that the invention also includes aspects in which the openings penetrate into substrate 12 during the etching utilized to penetrate through the masking layers 14 and 16.

Figure 3:
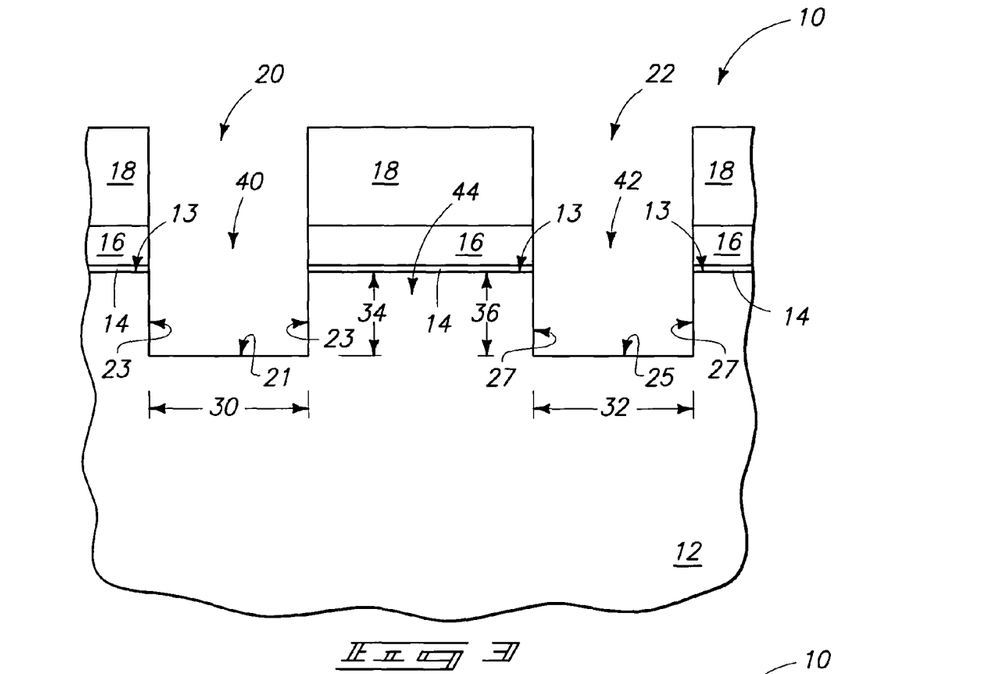
FIG. 3 is a view of the FIG. 1 wafer fragment shown at a processing stage subsequent to that of FIG. 2.

Referring to FIG. 3, openings 20 and 22 are extended into substrate 12 with an appropriate etch. In the shown aspect of the invention, such etching into the substrate occurs while photoresist 18 remains over mask layers 14 and 16, but it is to be understood that the invention also includes aspects in which photoresist 18 is removed after etching through one or more of the hard mask layers, and prior to any significant etching into the substrate 12. In some aspects, substrate 12 can correspond to monocrystalline silicon, and the etching of FIG. 3 can thus correspond to a silicon etch.

The etching into substrate 12 forms openings 40 and 42 (in some cases trenches) within the substrate. The openings 40 and 42 have bottoms (or bases) 21 and 25, respectively; and have sidewalls 23 and 27, respectively. The sidewalls extend from the bottoms to the top surface 13.

The openings 40 and 42 have widths 30 and 32, respectively, corresponding to distances between the sidewalls; and the openings 40 and 42 have depths 34 and 36, respectively, which correspond to the distance between the bottoms of the openings and the upper surface 13 of the substrate. The widths of the openings can be, for example, from about 5 nanometers to about 100 nanometers; in some aspects from about 7 nanometers to about 35 nanometers; and in some aspects from about from about 10 nanometers to about 100 nanometers. The depths of the openings can be, for example, from about 80 nanometers to about 400 nanometers; in some aspects from about 80 nanometers to about 150 nanometers; and in some aspects from about 100 nanometers to about 400 nanometers.

The openings formed within the substrate at the processing stage of FIG. 3 can be referred to as first openings to distinguish them from additional openings formed into the substrate at a subsequent processing stage (the additional openings are discussed below with reference to FIG. 6).

The formation of the openings 40 and 42 within the substrate leaves a mesa 44 of the substrate projecting upwardly between the openings. In some aspects, the openings 40 and 42 can be considered to be spaced from one another by the region of the substrate corresponding to mesa 44.

Figure 4:
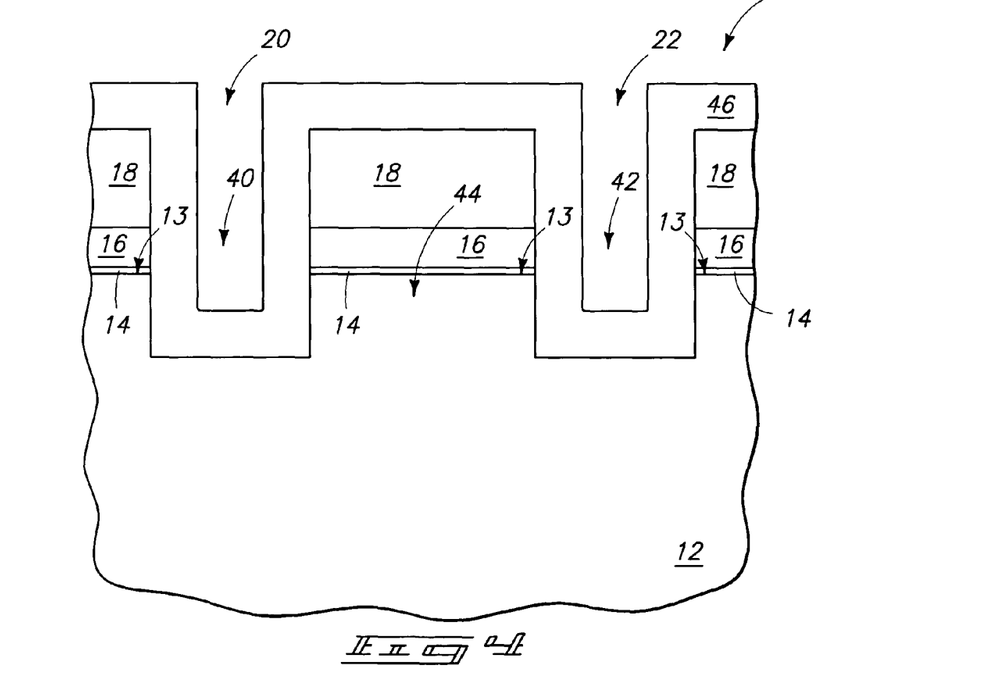
FIG. 4 is a view of the FIG. 1 wafer fragment shown at a processing stage subsequent to that of FIG. 3.

Referring to FIG. 4, a layer 46 is conformally formed over photoresist 18 and within openings 40 and 42. Layer 46 partially fills the openings, and accordingly defines a liner within the openings which narrows the openings. Layer 46 comprises carbon-containing material (in some aspects polymer), and can be referred to as a carbon-containing liner. In some aspects, layer 46 can predominantly comprise, consist essentially of, or consist of carbon.

Layer 46 can be formed by any suitable method. In particular aspects, the layer is formed by so-called mode technology. Initially, construction 10 is provided within a suitable reaction chamber, and then surfaces of the construction are exposed to a pre-deposition treatment with one or more of $C_2H_4$, $CH_4$, $CH_3F/N_2$, $CH_3F/CO$ and $C_2H_4/H_2$; at high pressure (typically a pressure of at least about 140 millitorr), and source power of from about 200 watts to about 1200 watts, with a source frequency of 2 MHz, 27 MHz or 60 MHz for a time of at least about 20 seconds (with a typical time being about 30 seconds).

Subsequently, and while the construction remains within the reaction chamber, formation of layer 46 is conducted utilizing alternating cycles of deposition and etch. Typically, three or more cycles of deposition/etch will be utilized to form the carbon-containing layer over the surfaces. The deposition can, for example, utilize one or more of $CH_3F/N_2$, $CH_3F/CO$, and $CH_3F/H_2$; and the etch can, for example, utilize one or both of $CF_4/Ar$ and $CH_3F/N_2$. In particular aspects, the initial treatment of the surfaces (discussed above) and the deposition components of the deposition/etch cycles will be conducted at a higher pressure than the etch components of the deposition/etch cycles. Also, the deposition components of the deposition/etch cycles can be conducted at lower substrate bias than the etch components of the deposition/etch cycles.

In an exemplary aspect, the deposition component of a deposition/etch cycle is conducted at a pressure of about 140 millitorr, with a source power of about 400 watts at about 27 MHz frequency, and for a time of at least about five seconds; and the etch component of the deposition/etch cycle is conducted at a pressure of about 40 millitorr, with a source power of about 800 watts at about 27 MHz frequency, and for a time that is at least about one second less than the time of the deposition component of the cycle. The deposition component of the deposition/etch cycle can utilize $CH_3F$ at a flow rate of about 150 standard cubic centimeters per minute (sccm), $N_2$ at a flow rate of about 75 sccm, and Ar at a flow rate of about 210 sccm, for a time of about 6 seconds. The etch component of the deposition/etch cycle can utilize $CF_4$ at a flow rate of about 75 sccm, for a time of about 4 seconds. In an exemplary application, the deposition/etch cycle is repeated 6 times, with each deposition component of each deposition/etch cycle being conducted for a time of about 12 seconds, and each etch component being conducted for a time of about 7 seconds.

The combination utilization of the above-discussed deposition/etch cycles can form layer 46 to have different properties along horizontal surfaces (such as over top surfaces of resist 18) than along vertical sidewall surfaces. In some aspects, the portion of layer 46 extending over horizontal top surfaces can be harder than the portion along sidewall surfaces; with the portion extending over top surfaces corresponding to one or both of graphite and diamond-like carbon, and the portion extending along sidewall surfaces corresponding to hydrocarbons or fluorocarbons. As is known to persons of ordinary skill in the art, graphite, diamond, hydrocarbons and fluorocarbons can all comprise repeating carbon-containing subunits.

Layer 46 can be formed to a thickness of, for example, from about 5 nanometers to about 50 nanometers; although preferred widths can vary depending on the width of opening 42.

Figure 5:
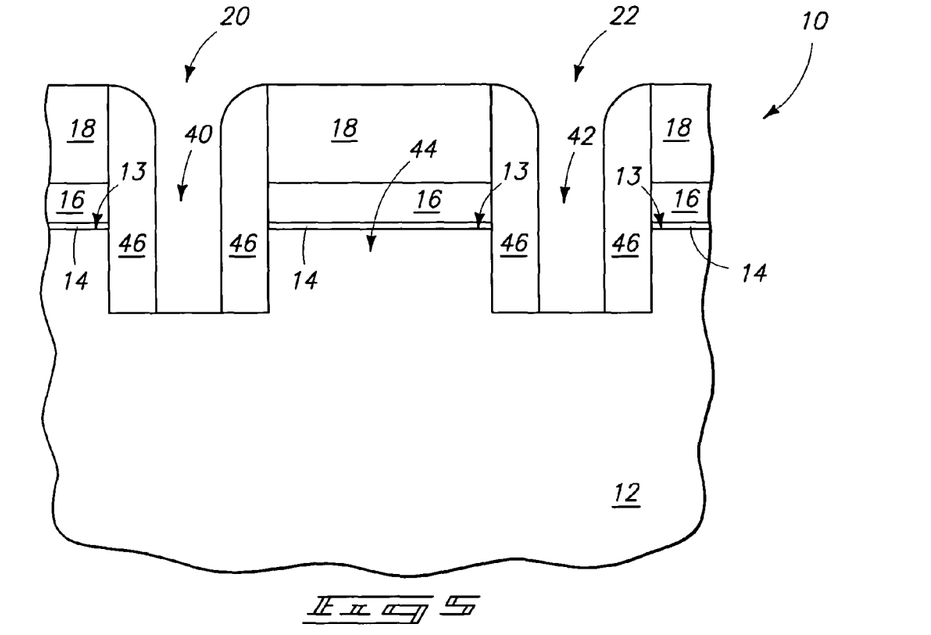
FIG. 5 is a view of the FIG. 1 wafer fragment shown at a processing stage subsequent to that of FIG. 4.

Referring to FIG. 5, liner 46 is subjected to an anisotropic etch which punches through the bottom of the liner to expose substrate 12 along the bottoms of the openings 40 and 42. The liner 46 remains along sidewalls of the openings so that it is only central regions of the bottoms of the openings which are exposed by the punch-through of the liner. The anisotropic etch of the liner can utilize any suitable chemistry, and in some aspects utilizes $CF_4/Ar$. For instance, the punch-through etch can utilize $CF_4$ at a flow rate of about 75 sccm, a pressure of about 40 millitorr, and a source power of about 400 watts at about 27 MHz, for a time about 20 seconds.

The punch-through etch can be conducted in the same reaction chamber as the deposition/etch cycle. In some aspects, the pre-treatment, deposition/etch cycles, and punch-through etch are all conducted in the same reaction chamber, and without breaking vacuum to the chamber from initiation of the pre-treatment until completion of the punch-through etch.

The shown punch-through etch is selective for liner 46 relative to substrate 12. The etch may also have some selectivity for liner 46 relative to photoresist 18, but typically such will be significantly less than the selectivity of the etch relative to substrate 12.

Figure 6:
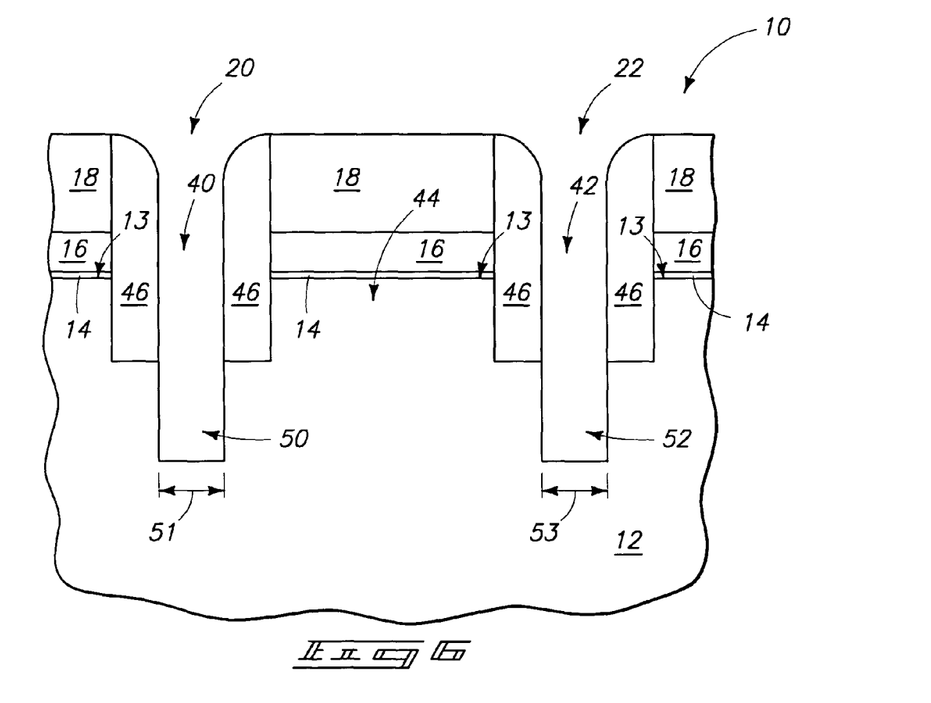
FIG. 6 is a view of the FIG. 1 wafer fragment shown at a processing stage subsequent to that of FIG. 5.

Referring to FIG. 6, the exposed regions of substrate 12 along the bases (or bottoms) of openings 40 and 42 are subjected to an etch which forms narrow openings 50 and 52 extending into substrate 12 from such bases. The openings 50 and 52 can be referred to as a second openings to distinguish them from the first openings 40 and 42. The openings 50 and 52 have widths 51 and 53 which are narrower than the widths 30 and 32 (FIG. 3) of the first openings. In particular aspects, widths 51 and 53 of the second openings can be less than or equal to about one-half of the widths of the first openings to which the second openings join.

The narrow openings 50 and 52 have bottoms (or bases), and sidewalls extending from the bottoms to the bases of the wide openings 40 and 42.

As mentioned above, the invention includes aspects in which openings 40 and 42 are trenches extending longitudinally into and out of the page relative to the cross-sectional views of the drawings. In such aspects, openings 50 and 52 can correspond to trenches which are narrower than the trenches 40 and 42 to which they join.

Figure 7:
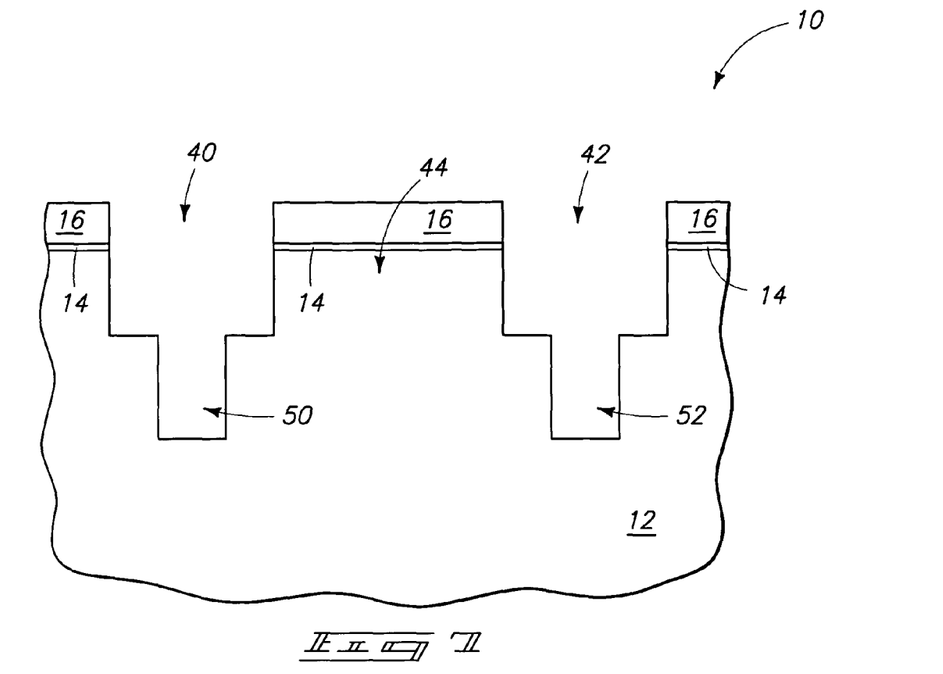
FIG. 7 is a view of the FIG. 1 wafer fragment shown at a processing stage subsequent to that of FIG. 6.

Referring to FIG. 7, photoresist 18 (FIG. 6) and remaining portions of liner 46 (FIG. 6) are removed. Such removal can be encompassed with any suitable etch, or combination of etches, and/or with ashing.

Figure 8:
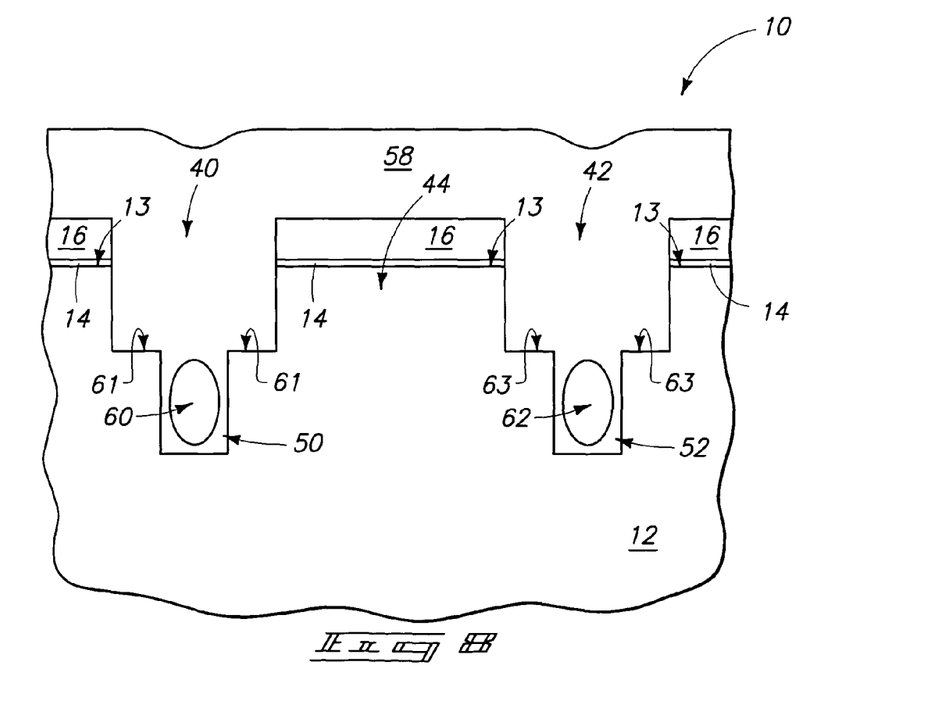
FIG. 8 is a view of the FIG. 1 wafer fragment shown at a processing stage subsequent to that of FIG. 7.

Referring next to FIG. 8, a substantially solid material 58 is deposited within openings 40, 42, 50 and 52, and over mask layers 14 and 16. The material fills wide openings 40 and 42, but leaves voids 60 and 62 within the narrow openings 50 and 52, respectively. Material 58 is referred to as being a "substantially solid" material to indicate that the material can be, but is not limited to, pure solids, but instead can also comprise gelatinous materials and other semi-solid materials including, for example, various glasses. The material 58 can comprise any suitable composition or combination of compositions, and although shown to be substantially homogeneous, can comprise multiple layers. In particular aspects, material 58 is an electrically insulative material suitable for formation of trenched isolation regions. In such aspects the material can, for example, comprise, consist essentially of, or consist of silicon dioxide. For example, material 58 can be silicon dioxide formed by high density plasma (HDP) deposition.

The narrow openings 50 and 52 are configured to at least substantially entirely retain the voids relative to the wide openings 40 and 42, with the term "substantially entirely retained within the narrow openings" meaning that the vast majority of the volume of a void is retained within a narrow opening rather than within the wide opening to which the narrow opening is joined. More specifically, such phrase means that at least about 75% of the volume of a void is retained within a narrow opening. In some aspects, the entirety of a void will be retained within the narrow opening. In other words, the entirety of the void will be at or below the elevational level of steps (in other words, the remaining portions of the bases of the wide openings) which join the narrow openings to the wide openings (exemplary steps are labeled 61 and 63 in FIG. 8).

In the shown aspect of the invention, the narrow openings have substantially vertical sidewalls, and similarly the wide upper openings have substantially vertical sidewalls. The steps 61 and 63 extend substantially perpendicularly to the substantially vertical sidewalls, and in some aspects can extend exactly perpendicularly to the substantially vertical sidewalls.

Utilization of perpendicularly-extending steps can provide clear delineation between the wide openings and the narrow openings joined thereto, which can assist in forcing the voids to be retained substantially entirely within the narrow openings. In contrast, utilization of steps having a very gradual slope between the narrow openings and the wide openings can create difficulty in controlling the location of the voids.

Figure 9:
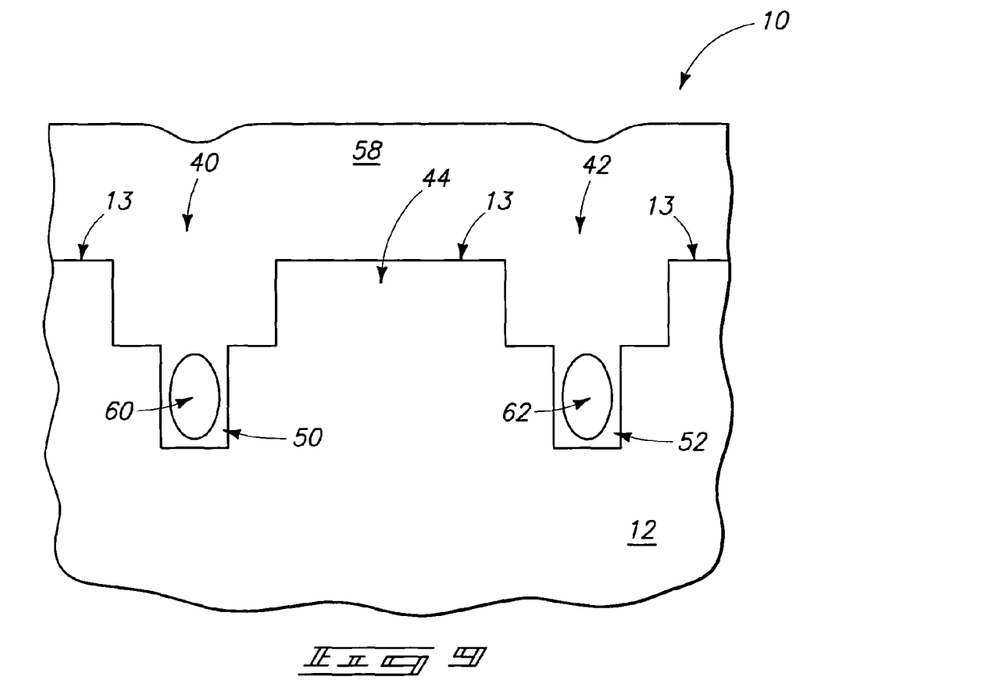
FIG. 9 is a view of the FIG. 1 wafer fragment shown at a processing stage subsequent to that of FIG. 7 in accordance with an aspect of the invention alternative to that of FIG. 8.

Although material 58 is formed over mask layers 14 and 16 in the aspect of the invention of FIG. 8, it is to be understood that the invention also encompasses aspects in which layers 14 and 16 are removed prior to formation of material 58. Such aspect is shown in FIG. 9. The removal of layers 14 and 16 can be accomplished by any suitable etch, and/or by planarization.

Figure 10:
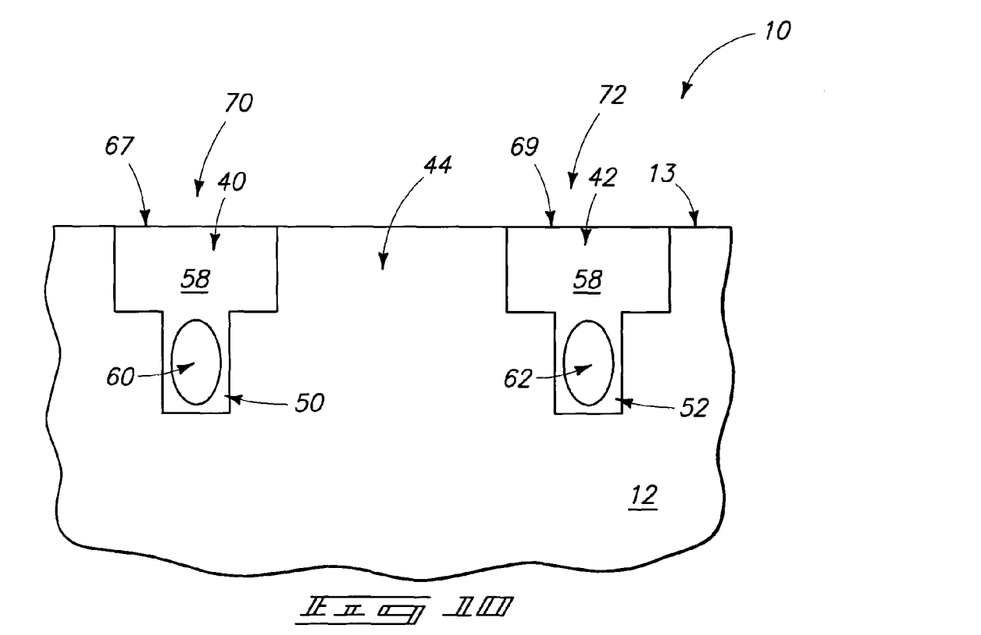
FIG. 10 is a view of the FIG. 1 wafer fragment shown at a processing stage subsequent to that of FIG. 8 or to that of FIG. 9.

Regardless of whether the aspect of FIG. 8 is utilized, or that of FIG. 9 is utilized, material 58 is subsequently subjected to planarization (such as, for example, chemical-mechanical polishing) to remove the material from over the substrate and form the structure of FIG. 10. If the aspect of FIG. 8 is utilized, such planarization will also remove mask layers 14 and 16 from over substrate 12. The planarization forms the shown planarized uppermost surfaces 67 and 69 of the material 58 across openings 40 and 42, respectively. Such planarized uppermost surfaces are co-planar with the uppermost surface 13 of substrate 12. In some aspects, some of substrate 12 can be removed during the planarization so that the planarized surface 13 of FIG. 8 (or FIG. 9) is not the same surface as the planarized surface 13 that existed prior to planarization material 58.

If the material 58 within openings 40, 42, 50 and 52 is electrically insulative, such material can form trenched isolation regions within the openings. In such aspects, the voids 60 and 62 can also be considered to be part of the trenched isolation regions. It can be advantageous to incorporate the voids into trenched isolation regions in that the voids will typically have very low dielectric constants, which can be desired for some applications of trenched isolation regions.

It is noted that the voids 60 and 62 will typically be filled with gas. If material 58 seals the voids from the atmosphere exterior of material 58, the particular gas within the voids can be the ambient present during deposition of material 58 at the processing stage of FIG. 8 (or FIG. 9), and/or gases formed by out-gassing from material 58 during deposition of the material. In some aspects of the invention, the material 58 can be referred to as a non-gaseous material to distinguish the material from the voids 60 and 62 extending therein.

Figure 11:
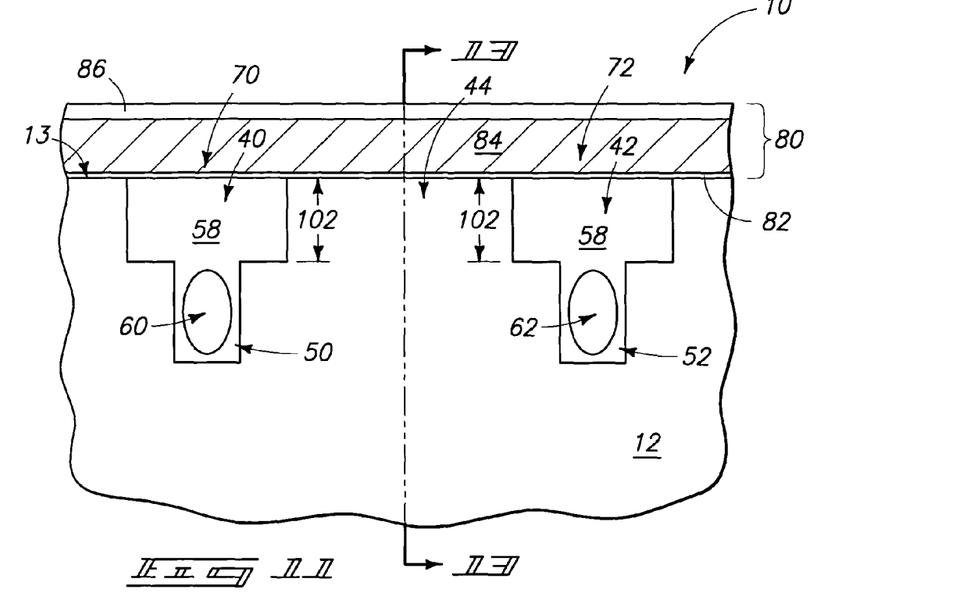
FIG. 11 is a view of the FIG. 1 wafer fragment shown at a processing stage subsequent to that of FIG. 10.
Figure 12:
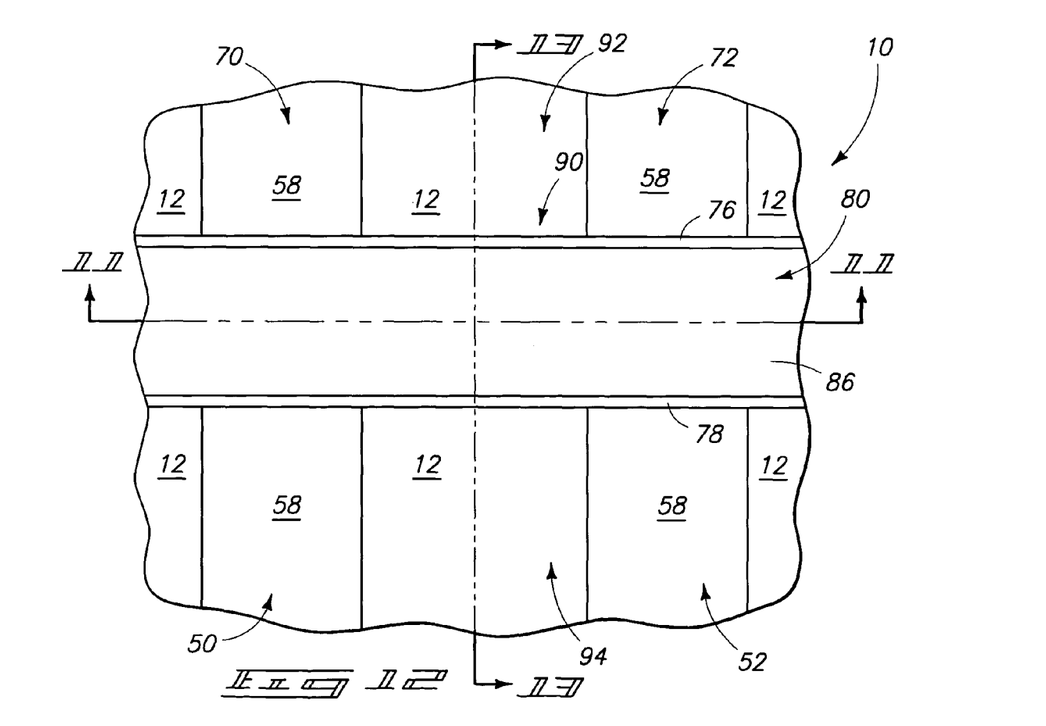
FIG. 12 is a top view of the wafer fragment at the processing stage of FIG. 11, with the cross-section of FIG. 11 being along the line 11-11.
Figure 13:
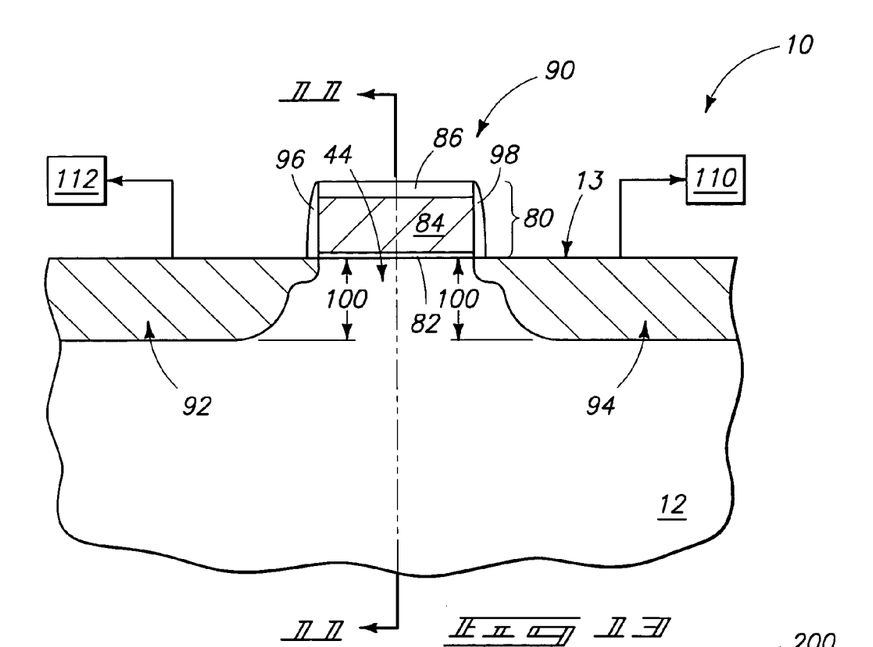
FIG. 13 is a diagrammatic, cross-sectional view along the lines 13-13 of FIGS. 11 and 12. The cross-section of FIG. 11 is along the line 11-11 of FIG. 13.

The trenched isolation region formed within openings 40 and 50 can be referred to as a first trenched isolation region 70, and the trenched isolation region formed within openings 42 and 52 can be referred to as a second trenched isolation region 72. Any suitable circuitry can be formed proximate the trenched isolation regions to incorporate the trenched isolation regions into an integrated circuit construction. FIGS. 11-13 show a wordline 80 formed across isolation regions 70 and 72, and show a transistor device 90 incorporating a portion of the wordline as a transistor gate.

Referring to FIG. 11, the wordline 80 is shown to comprise a stack comprising dielectric material 82, conductive material 84, and an insulative cap 86. The dielectric material 82 can comprise any suitable gate dielectric, including, for example, silicon dioxide. In particular aspects, the dielectric material will comprise, consist essentially of, or consist of silicon dioxide. The conductive gate material 84 can comprise any suitable electrically conductive composition or combination of compositions; and in particular aspects will comprise, consist essentially of, or consist of one or more of conductively-doped semiconductor material (such as, conductively-doped silicon), metal (such as tungsten or titanium), and metal compounds (such as titanium suicide). The electrically insulative cap 86 can comprise any suitable composition or combination of compositions, and in particular aspects will comprise, consist essentially of, or consist of one or more of silicon dioxide, silicon nitride, and silicon oxynitride.

The wordline 80 extends across the trenched isolation regions 70 and 72, and also across the semiconductor substrate region 44 between the trenched isolation regions. The transistor construction 90 (which will be described in more detail below, and which is more clearly illustrated in FIGS. 12 and 13) is over and within the region 44 of semiconductor substrate 12. Accordingly, the semiconductor material of substrate 12 that is within region 44 and directly below the wordline 80 can be doped with an appropriate threshold voltage implant, as such is a channel region of a transistor device.

Referring to FIG. 12, such shows a top view of a fragment comprising the cross-section of FIG. 11, and shows that the materials 82, 84 and 86 are patterned as a line extending across the substrate 12 and the isolation regions 70 and 72. Such also shows that the isolation regions 70 and 72 are trenches extending substantially orthogonally to the direction of the wordline 80.

Referring to FIG. 13, such shows a cross-section through the fragment of FIG. 12, and orthogonal to the cross-section discussed above with reference to FIG. 11. The cross-section of FIG. 13 shows that the transistor device 90 comprises source/drain regions 92 and 94 extending into the semiconductor substrate 12 on opposing sides of the wordline 80. The cross-section of FIG. 13 also shows that sidewall spacers 96 and 98 are formed along sidewalls of the stacked materials 82, 84 and 86. Such sidewall spacers can be conventional spacers as utilized in the art along sidewalls of wordlines, and can comprise, for example, one or more of silicon dioxide, silicon nitride and silicon oxynitride.

The source/drain regions 92 and 94 of FIG. 13 extend into substrate 12 to a depth 100; and the void regions 60 and 62 of FIG. 11 are retained at or below a depth 102 within substrate 12. In other words, the void regions 60 and 62 have uppermost surfaces that are beneath the surface 13 of substrate 12 by a depth 102, and the source/drain regions have lowermost surfaces that are at the depth 100 within substrate 12. In some aspects of the invention, the depths of the voids can be such that the voids are entirely beneath the elevational level of the source/drain regions within substrate 12. In other aspects, the source/drain regions elevationally overlap the voids within substrate 12. The voids can be considered an insulative material that is part of the isolation regions 70 and 72. In some aspects it can be advantageous for the source/drain regions to overlap such insulative material corresponding to the voids, and in other aspects it can be advantageous if the source/drain regions do not elevationally overlap such insulative material.

The transistor device 90 can be utilized in numerous applications, including, for example, in memory cells. If the transistor device is utilized in memory cells, one of the source/drain regions 92 and 94 can be electrically coupled to a charge storage device, while the other is electrically coupled to a bitline. In the shown aspect of FIG. 13, the source/drain region 94 is electrically coupled to a charge storage device 110, while the source/drain region 92 is electrically coupled to a bitline 112. The charge storage device can be, for example, a capacitor. As will be recognized by persons of ordinary skill in the art, the combination of a transistor with a capacitor can be considered to correspond to a dynamic random access memory (DRAM) cell. Accordingly, the transistor device 90 can be incorporated into a memory cell. In some aspects of the invention, a plurality of such memory cells can be formed across a semiconductor substrate to form a memory array.

The transistor structure of FIGS. 11-13 is but one of many types of transistor structures that can be utilized in integrated circuitry. Other types of structures can include, for example, programmable read only memory (PROM) devices. As will be recognized by persons of ordinary skill in the art, PROM devices can utilize conductive gate material similar to the gate material 84 of FIGS. 11-13.

The aspect of the invention discussed above formed the carbon-containing liner 46 (FIGS. 4-6) over photoresist 18. The invention encompasses other aspects in which photoresist 18 is removed prior to formation of liner 46. Such aspects are discussed with reference to FIGS. 14-18. Similar numbering will be utilized in describing FIGS. 14-18 as was used above in describing FIGS. 1-13, where appropriate.

Figure 14:
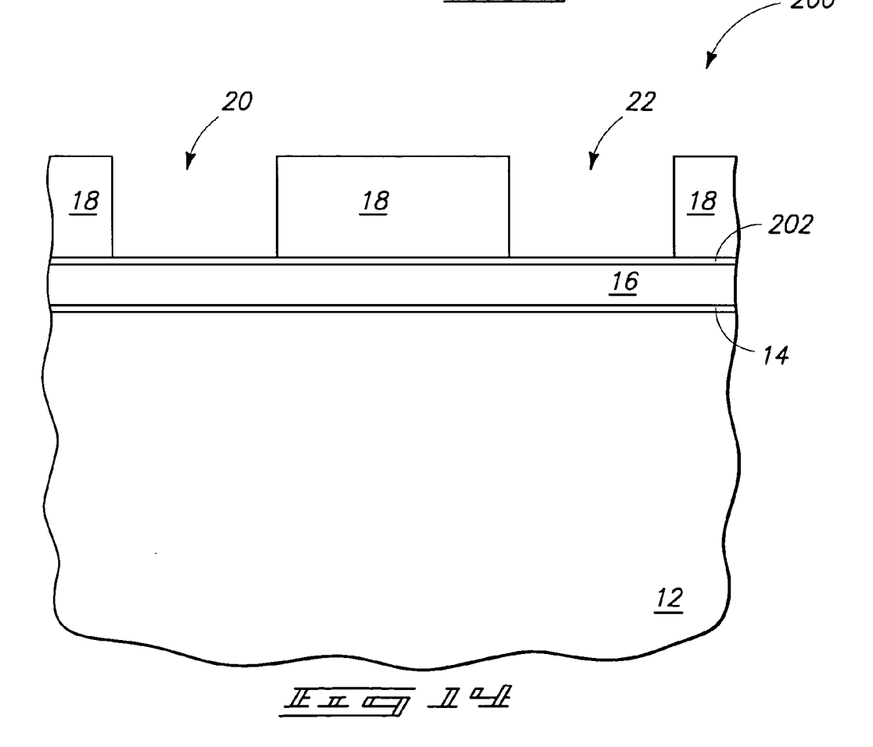
FIG. 14 is a diagrammatic, cross-sectional view of a fragment of a semiconductor construction at a preliminary processing stage in accordance with another exemplary aspect of the present invention.

Referring to FIG. 14, a construction 200 is illustrated at a processing stage analogous to that of the construction 10 the of FIG. 1. The construction 200 comprises the substrate 12, hard mask layers 14 and 16, and patterned photoresist 18 discussed above with reference to FIG. 1. Further, the patterned photoresist 18 defines openings 20 and 22 as discussed above with reference to FIG. 1.

Construction 200 differs from the construction 10 of FIG. 1 in that construction 200 comprises a third hard mask layer 202 in addition to the hard mask layers 14 and 16. Hard mask layer 202 can, for example, comprise, consist essentially of, or consist of silicon dioxide. The third hard mask layer 202 can be provided to provide selectivity during a subsequent etch of silicon-containing substrate 12 (discussed below with reference to FIG. 17) that could be difficult to achieve if silicon nitride-containing layer 16 were exposed to the etching conditions rather than silicon oxide-containing layer 202.

Figure 15:
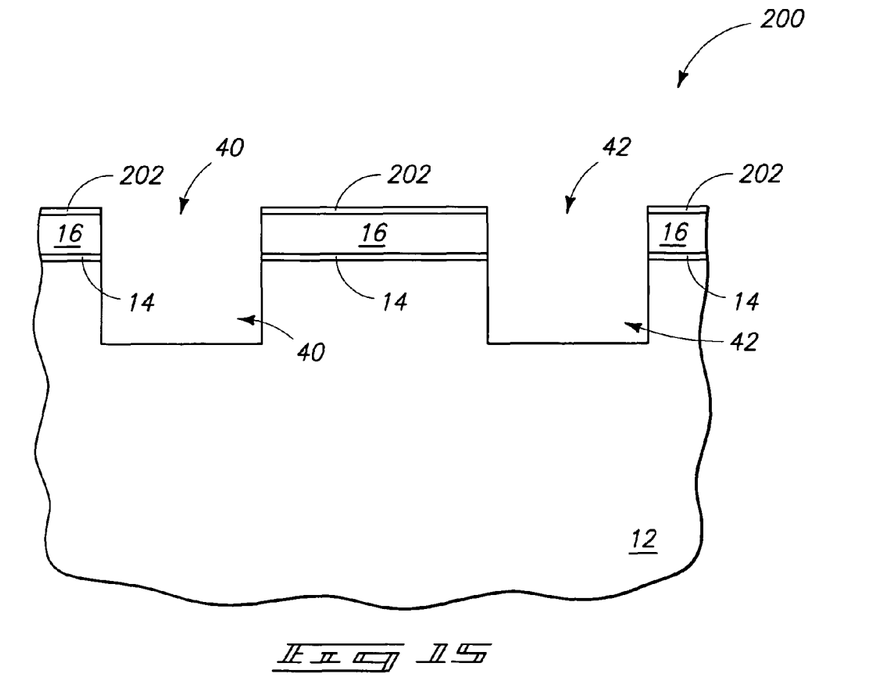
FIG. 15 is a view of the FIG. 14 wafer fragment shown at a processing stage subsequent to that of FIG. 14.

Referring next to FIG. 15, openings 20 and 22 are extended through hard mask layers 14, 16 and 202, and into substrate 12. Also, photoresist 18 (FIG. 14) is removed. The openings can be extended through layers 14, 16 and 202, and into substrate 12, with any suitable etch or combination of etches. In particular aspects, the openings are extended through layers 14, 16 and 202, and the photoresist is then removed. Subsequently, the openings are extended into the substrate 12. The portions of the openings within substrate 12 can correspond identically to the wide openings 40 and 42 within the substrate that were discussed above with reference to FIG. 3.

Figure 16:
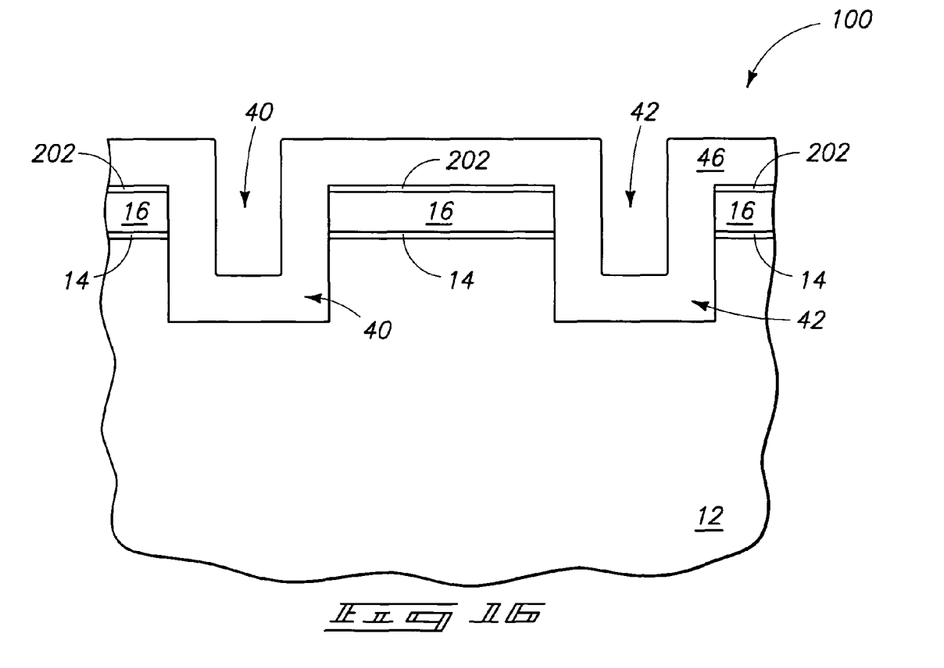
FIG. 16 is a view of the FIG. 14 wafer fragment shown at a processing stage subsequent to that of FIG. 15.

Referring to FIG. 16, the carbon-containing liner 46 is formed within the openings to narrow the openings.

Figure 17:
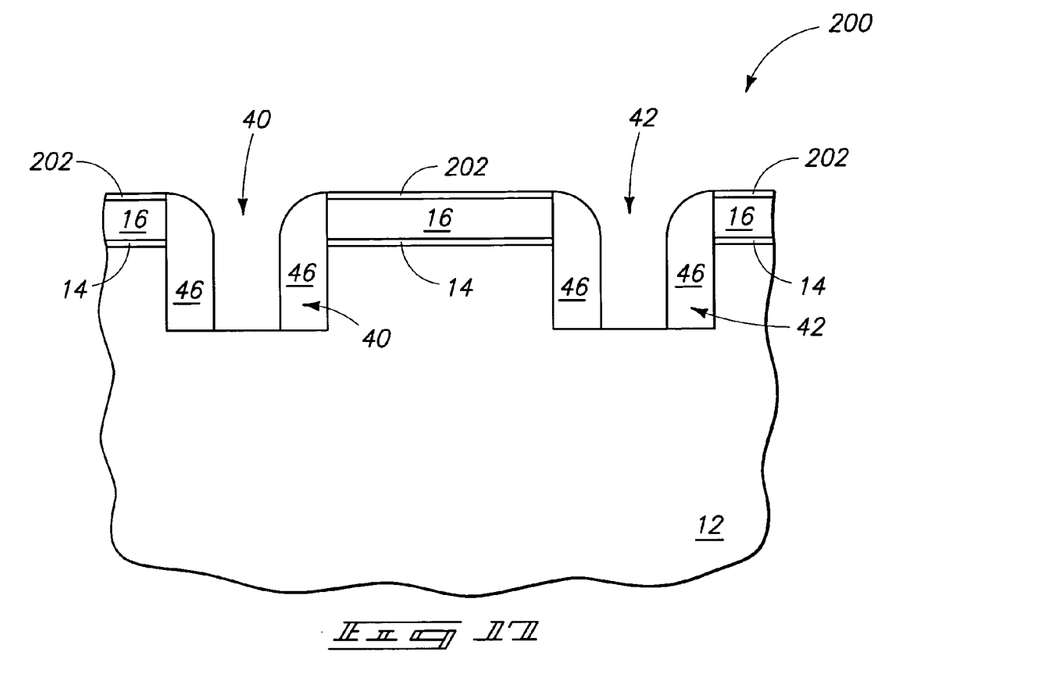
FIG. 17 is a view of the FIG. 14 wafer fragment shown at a processing stage subsequent to that of FIG. 16.

Referring to FIG. 17, the liner 46 is subjected to anisotropic etching to punch through the liner at the bottoms of openings 40 and 42, and to thus expose substrate 12 at the bottoms of such openings. The etch of liner 46 can be identical to the punch-through etch discussed above with reference to FIG. 5.

Figure 18:
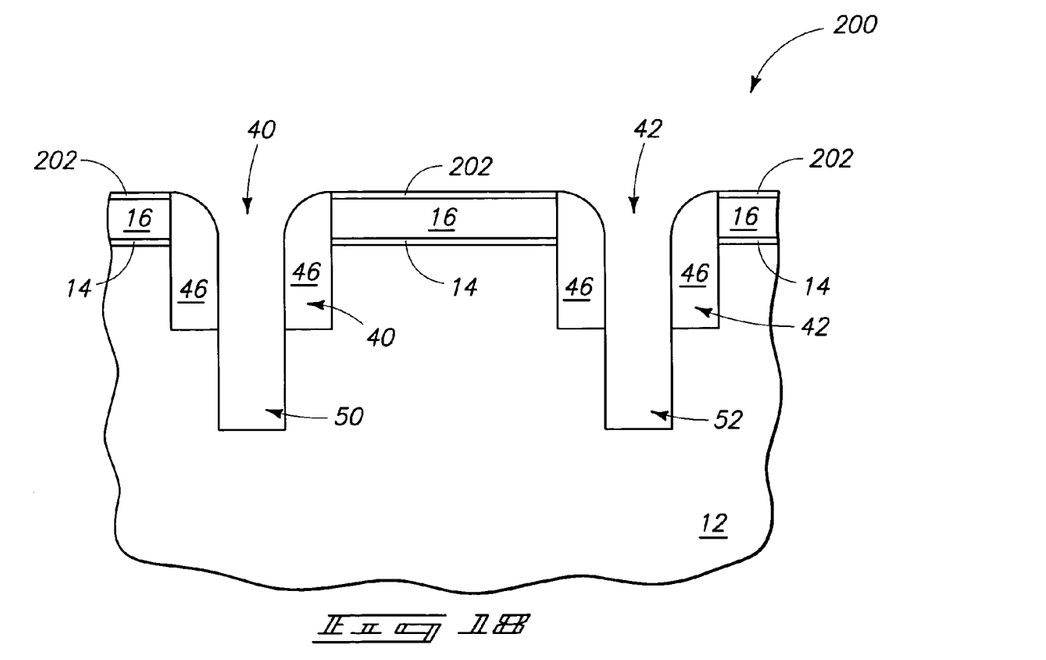
FIG. 18 is a view of the FIG. 14 wafer fragment shown at a processing stage subsequent to that of FIG. 17.

Referring to FIG. 18, substrate 12 is etched from the bottoms openings 40 and 42 to form narrow openings 50 and 52 extending into the substrate. In typical aspects, the substrate removed to form openings 50 and 52 will comprise, consist essentially of, or consist of monocrystalline silicon. The substrate can be removed with any suitable silicon etch. It is often difficult to selectively remove silicon relative to silicon nitride, but relatively easy to selectively remove the silicon relative to silicon dioxide. Accordingly, it can be advantageous to either not use silicon nitride materials for the hard mask layers, or, if silicon nitride materials are used, to protect such materials with an overlying layer of silicon dioxide. Accordingly, silicon dioxide-containing layer 202 is formed over silicon nitride-containing layer 16 in the shown aspect of the invention to protect the silicon nitride-containing layer during the silicon etch into substrate 12.

Figure 19:
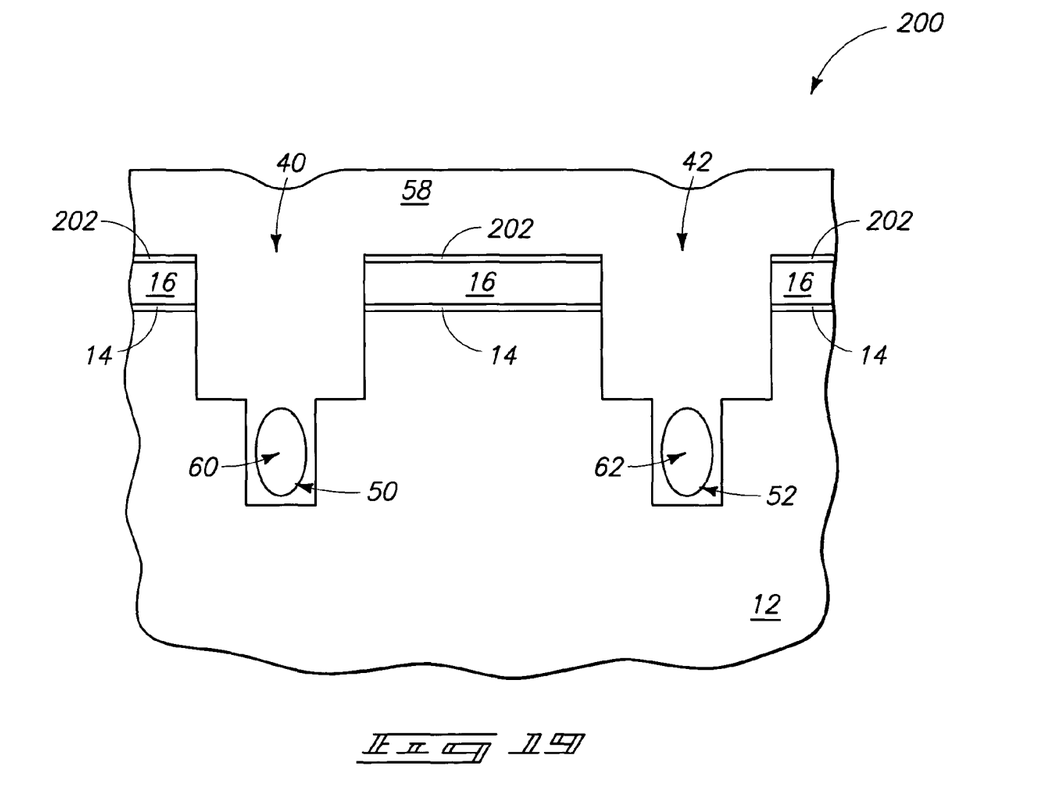
FIG. 19 is a view of the FIG. 14 wafer fragment shown at a processing stage subsequent to that of FIG. 18.

Referring next to FIG. 19, remaining portions of liner 46 (FIG. 18) are removed, and subsequently material 58 is formed within openings 40, 42, 50 and 52; with the material 58 substantially filling the openings and leaving voids 60 and 62 within narrowed openings 50 and 52. In some aspects of the invention (not shown) remaining portions of liner 46 can remain within the openings as material 58 is formed therein so that the portions of the liner and material 58 together substantially fill the openings. The construction of FIG. 19 can subsequently be subjected to planarization to form a construction identical to that discussed above with reference to FIG. 10.

In some aspects of the invention, the shape of the trenches (50 and 52 of FIG. 18) can be "engineered" to accommodate the trench profile suitable for the trench fill process, such as HDP, TEOS or SOD, and thus potentially eliminate the voids. For example, the shape of the spacer 46 can be formed with a slope; and/or while etching the trenches 50 and 52 a continuous polymer film can be deposited along the trench sidewalls, thereby making the sidewalls of trenches 50 and 52 less steep.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a semiconductor construction, comprising:
   providing a semiconductor substrate having a first opening extending therein;
   forming a carbon-containing liner within the first opening;
   punching through a bottom of the liner to expose the substrate along a bottom of the first opening, and to leave a remaining portion of the liner along sidewalls of the first opening;
   in a method step different from the punching through, etching into the exposed substrate along the bottom of the first opening to form a second opening which is narrower than the first opening and which joins to the first opening;
   forming electrically insulative material within the first and second openings;
   wherein the forming of the carbon-containing liner comprises three or more cycles of deposition/etch; with the deposition utilizing one or more of $CH_3F/N_2$, $CH_3F/CO$, and $CH_3F/H_2$; and with the etch utilizing one or more of $CF_4/Ar$ and $CH_3F/N_2$;
   wherein the deposition is conducted at lower substrate bias than the etch; and
   wherein the deposition of each cycle is conducted for at least about 5 seconds, and wherein the etch of each cycle is conducted for at least one second less than the deposition of each cycle.

2. The method of claim 1 wherein the punching through the bottom of the carbon-containing liner utilizes $CF_4/Ar$.

3. The method of claim 1 further comprising removing the remaining portion of the liner prior to the forming of the electrically insulative material within the first and second openings.

4. The method of claim 3 wherein the forming of the electrically insulative material substantially fills the first opening while leaving a void within the second opening.

5. A method of forming a semiconductor construction, comprising:
   providing a semiconductor substrate;
   forming at least one hard mask layer over the substrate;
   patterning the at least one hard mask layer to expose a region of the substrate;
   etching into the exposed region of the substrate to form a first opening having a first width;
   narrowing the first opening with a conformal layer of carbon-containing material;
   etching through the conformal layer to expose the substrate along a bottom of the narrowed opening;
   etching into the exposed substrate along the bottom of the narrowed opening to form a second opening which joins to the first opening and which has a second width less than the first width;
   removing the carbon-containing material from within the first opening; and
   forming electrically insulative material within the first and second openings, the electrically insulative material substantially filling the first opening and leaving a void substantially entirely retained within the second opening.

6. The method of claim 5 wherein the electrically insulative material comprises silicon and oxygen.

7. The method of claim 5 wherein the electrically insulative material consists of silicon dioxide.

8. The method of claim 5 further comprising removing the at least one hard mask layer before forming the electrically insulative material within the first and second openings.

9. The method of claim 5 further comprising removing the at least one hard mask layer after forming the electrically insulative material within the first and second openings.

10. The method of claim 5 wherein the at least one hard mask layer comprises a first layer and a second layer over the first layer; with the first layer comprising silicon dioxide, and with the second layer comprising silicon nitride.

11. The method of claim 5 wherein the at least one hard mask layer comprises a first layer, a second layer over the first layer, and a third layer over the second layer; with the first layer comprising silicon dioxide, the second layer comprising silicon nitride, and the third layer comprising silicon dioxide.

12. The method of claim 5 wherein the forming of the conformal layer of carbon-containing material comprises:
   initial treatment of surface of the substrate within the first opening with one or more of $C_2H_4$, $CH_4$, and $C_2H_4/H_2$; and
   three or more cycles of deposition/etch to form the carbon-containing material over the surfaces; with the deposition utilizing one or more of $CH_3F/N_2$, $CH_3F/CO$, and $CH_3F/H_2$; and the etch utilizing one or more of $CF_4/Ar$ and $CH_3F/N_2$.

13. The method of claim 5 wherein the etching through the conformal layer of carbon-containing material utilizes $CF_4/Ar$.

14. A method of forming a semiconductor construction, comprising:
   providing a monocrystalline silicon substrate having a substantially planar top surface;
   forming a silicon dioxide-containing layer over the substantially planar top surface;
   forming a silicon nitride-containing layer over the silicon dioxide-containing layer;
   forming a patterned photoresist mask over the silicon nitride-containing layer;
   transferring a pattern from the photoresist mask through the silicon nitride-containing layer and through the silicon dioxide-containing layer to expose a region of the substrate;
   etching into the exposed region of the substrate to form a first trench in the substrate; the first trench having a first bottom and sidewalls extending from the top surface of the substrate to said first bottom, having a first width between the sidewalls, and having a first depth from the top surface of the substrate to the first bottom;
   forming a carbon-containing layer within the first trench to narrow the first trench, the carbon-containing layer extending along the first bottom and sidewalls of the first trench;
   etching through the carbon-containing layer along the first bottom to expose a central region of the first bottom;
   etching into the exposed central region to form a second trench extending downwardly from the first bottom; the second trench having a second bottom and having sidewalls extending from the first bottom to the second bottom; the second trench having a second width between the second sidewalls, and having a second depth from the first bottom to the second bottom;
   removing the carbon-containing layer from the sidewalls of the first trench; and
   after removing the carbon-containing layer from the sidewalls of the first trench, forming electrically insulative material within the first and second trenches, the electrically insulative material substantially filling the first trench and leaving a void substantially entirely retained within the second trench.

15. The method of claim 14 wherein the etching through the carbon-containing layer along the first bottom utilizes $CF_4/Ar$.

16. The method of claim 14 wherein the electrically insulative material comprises silicon and oxygen.

17. The method of claim 14 wherein the electrically insulative material consists essentially of silicon dioxide.

18. The method of claim 14 wherein the carbon-containing layer is formed over the patterned photoresist mask.

19. The method of claim 14 wherein the forming of the carbon-containing layer comprises:
   initial treatment of surfaces with one or more of $C_2H_4$, $CH_4$, and $C_2H_4/H_2$; and
   three or more cycles of deposition/etch to form the carbon-containing layer over the surfaces; with the deposition utilizing one or more of $CH_3F/N_2$, $CH_3F/CO$, and $CH_3F/H_2$; and the etch utilizing one or more of $CF_4/Ar$ and $CH_3F/N_2$.

20. The method of claim 19 wherein the initial treatment and deposition are conducted at higher pressure than the etch.

21. The method of claim 20 wherein the deposition is conducted at lower substrate bias than the etch.

22. The method of claim 21 wherein the deposition of each cycle is conducted for at least about 5 seconds, and wherein the etch of each cycle is conducted for at least one second less than the deposition of each cycle.

23. The method of claim 14 wherein the patterned photoresist mask is removed prior to the forming of the carbon-containing layer.

24. The method of claim 23 wherein the silicon dioxide-containing layer is a first silicon dioxide-containing layer, and further comprising forming a second silicon dioxide-containing layer over the silicon nitride-containing layer prior to the forming of the carbon-containing layer.

25. The method of claim 24 wherein the second silicon dioxide-containing layer is formed prior to forming of the patterned photoresist mask, and wherein the transferring of the pattern from the photoresist mask comprises transferring the pattern through the second silicon dioxide-containing layer.

26. A method of forming a semiconductor construction, comprising:
   providing a semiconductor substrate;
   forming a patterned hard mask over the substrate;
   transferring a pattern from the patterned hard mask into the substrate to form a pair of first openings extending into the substrate; the first openings being spaced from one another by a region of the semiconductor substrate;
   forming carbon-containing liners within the first openings;
   punching through bottoms of the liners to expose the substrate along bottoms of the first openings, and to leave remaining portions of the liners along sidewalls of the first openings;
   etching into the exposed substrate along the bottoms of the first openings to form second openings which join to the first openings, and which are narrower than the first openings;
   after forming the second openings, removing the remaining portions of the liners;
   forming electrically insulative material within the first and second openings;
   removing the hard mask from over said region of the semiconductor substrate between the first openings;
   forming a transistor having a gate over said region of the semiconductor substrate between the first openings;
   wherein the formation of the electrically insulative material occurs after the removal of the hard mask; and
   wherein the punching through bottoms of the liners utilizes $CF_4/Ar$.

27. The method claim 26 wherein the electrically insulative material comprises silicon and oxygen.

28. The method of claim 26 wherein the hard mask comprises a first layer and a second layer over the first layer; with the first layer comprising silicon dioxide, and the second layer comprising silicon nitride.

29. The method of claim 26 wherein the hard mask comprises a first layer, a second layer over the first layer, and a third layer over the second layer; with the first layer comprising silicon dioxide, the second layer comprising silicon nitride, and the third layer comprising silicon dioxide.

30. The method of claim 26 wherein the forming of the carbon-containing liners comprises:
   initial treatment of surface of the substrate within the first opening with one or more of $C_2H_4$, $CH_4$, and $C_2H_4/H_2$; and
   three or more cycles of deposition/etch to form the carbon-containing liners over the surfaces; with the deposition utilizing one or more of $CH_3F/N_2$, $CH_3F/CO$, and $CH_3F/H_2$; and the etch utilizing one or more of $CF_4/Ar$ and $CH_3F/N_2$.

31. A method of forming a semiconductor construction, comprising:
   providing a semiconductor substrate having a first opening extending therein;
   forming a carbon-containing liner within the first opening;
   punching through a bottom of the liner to expose the substrate along a bottom of the first opening, and to leave a remaining portion of the liner along sidewalls of the first opening;
   etching into the exposed substrate along the bottom of the first opening to form a second opening which is narrower than the first opening and which joins to the first opening;
   forming electrically insulative material within the first and second openings;
   wherein the forming of the carbon-containing liner comprises three or more cycles of deposition/etch; with the deposition utilizing one or more of $CH_3F/N_2$, $CH_3F/CO$, and $CH_3F/H_2$; and with the etch utilizing one or more of $CF_4/Ar$ and $CH_3F/N_2$;
   wherein the deposition is conducted at lower substrate bias than the etch; and
   wherein the deposition of each cycle is conducted for at least about 5 seconds, and wherein the etch of each cycle is conducted for at least one second less than the deposition of each cycle.

32. A method of forming a semiconductor construction, comprising:
   providing a semiconductor substrate;
   forming a patterned hard mask over the substrate;
   transferring a pattern from the patterned hard mask into the substrate to form a pair of first openings extending into the substrate; the first openings being spaced from one another by a region of the semiconductor substrate;
   forming carbon-containing liners within the first openings;
   punching through bottoms of the liner to expose the substrate along bottoms of the first openings, and to leave remaining portions of the liners along sidewalls of the first openings;
   etching into the exposed substrate along the bottoms of the first openings to form second openings which join to the first openings, and which are narrower than the first openings;
   after forming the second openings, removing the remaining portions of the liners;
   forming electrically insulative material within the first and second openings;
   removing the hard mask from over said region of the semiconductor substrate between the first openings;
   forming a transistor having a gate over said region of the semiconductor substrate between the first openings; and
   wherein the hard mask comprises a first layer, a second layer over the first layer, and a third layer over the second layer; with the first layer comprising silicon dioxide, the second layer comprising silicon nitride, and the third layer comprising silicon dioxide.

33. A method of forming a semiconductor construction, comprising:
   providing a semiconductor substrate;
   forming a patterned hard mask over the substrate;
   transferring a pattern from the patterned hard mask into the substrate to form a pair of first openings extending into the substrate; the first openings being spaced from one another by a region of the semiconductor substrate;
   forming carbon-containing liners within the first openings;
   punching through bottoms of the liner to expose the substrate along bottoms of the first openings, and to leave remaining portions of the liners along sidewalls of the first openings;
   etching into the exposed substrate along the bottoms of the first openings to form second openings which join to the first openings, and which are narrower than the first openings;
   after forming the second openings, removing the remaining portions of the liners;
   forming electrically insulative material within the first and second openings;
   removing the hard mask from over said region of the semiconductor substrate between the first openings;
   forming a transistor having a gate over said region of the semiconductor substrate between the first openings; and
   wherein the forming of the carbon-containing liners comprises;
      initial treatment of surface of the substrate within the first opening with one or more of $C_2H_4$, $CH_4$, and $C_2H_4/H_2$; and
      three or more cycles of deposition/etch to form the carbon-containing liners over the surfaces; with the deposition utilizing one or more of $CH_3F/N_2$, $CH_3F/CO$, and $CH_3F/H_2$; and the etch utilizing one or more of $CF_4/Ar$ and $CH_3F/N_2$.

34. A method of forming a semiconductor construction, comprising:
   providing a semiconductor substrate;
   forming a patterned hard mask over the substrate;
   transferring a pattern from the patterned hard mask into the substrate to form a pair of first openings extending into the substrate; the first openings being spaced from one another by a region of the semiconductor substrate;
   forming carbon-containing liners within the first openings;
   punching through bottoms of the liners to expose the substrate along bottoms of the first openings, and to leave remaining portions of the liners along sidewalls of the first openings;
   etching into the exposed substrate along the bottoms of the first openings to form second openings which join to the first openings, and which are narrower than the first openings;
   after forming the second openings, removing the remaining portions of the liners;
   forming electrically insulative material within the first and second openings;
   removing the hard mask from over said region of the semiconductor substrate between the first openings;
   forming a transistor having a gate over said region of the semiconductor substrate between the first openings;
   wherein the formation of the electrically insulative material occurs after the removal of the hard mask; and
   wherein the hard mask comprises a first layer, a second layer over the first layer, and a third layer over the second layer; with the first layer comprising silicon dioxide, the second layer comprising silicon nitride, and the third layer comprising silicon dioxide.

35. A method of forming a semiconductor construction, comprising:

provinding a semiconductor substrate;

forming a patterned hard mask over the substrate;

transferring a pattern from the patterned hard mask into the substrate to form a pair of first openings extending into the substrate; the first openings being spaced from one another by a region of the semiconductor substrate;

forming carbon-containing liners within the first openings;

punching through bottoms of the liners to expose the substrate along bottoms of the first openings, and to leave remaining portions of the liners along sidewalls of the first openings;

etching into the exposed substrate along the bottoms of the first openings to form second openings which join to the first openings, and which are narrower than the first openings;

after forming the second openings, removing the remaining portions of the liners;

forming electrically insulative material within the first and second openings;

removing the hard mask from over said region of the semiconductor substrate between the first openings;

forming a transistor having a gate over said region of the semiconductor substrate between the first openings;

wherein the formation of the electrically insulative material occurs after the removal of the hard mask;

wherein the forming of the carbon-containing liners comprises:

initial treatment of surface of the substrate within the first opening with one or more of $C_2H_4$, $CH_4$, and $C_2H_4/H_2$; and three or more cycles of deposition/etch to form the carbon-containing liners over the surfaces; with the deposition utilizing one or more of $CH_3F/N_2$, $CH_3F/CO$, and $CH_3F/H_2$; and the etch utilizing one or more of $CF_4/Ar$ and $CH_3F/N_2$.

* * * * *